(12) United States Patent
Hoshi et al.

(10) Patent No.: US 11,251,052 B2
(45) Date of Patent: Feb. 15, 2022

(54) PLASMA PROCESSING METHOD AND PLASMA PROCESSING APPARATUS

(71) Applicant: TOKYO ELECTRON LIMITED, Tokyo (JP)

(72) Inventors: Naotsugu Hoshi, Miyagi (JP); Tetsuya Ohishi, Miyagi (JP); Shinji Higashitsutsumi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/021,053

(22) Filed: Jun. 28, 2018

(65) Prior Publication Data
US 2019/0006188 A1    Jan. 3, 2019

(30) Foreign Application Priority Data
Jun. 29, 2017 (JP) .............................. JP2017-127826

(51) Int. Cl.
| H01L 21/311 | (2006.01) |
| G03F 7/42 | (2006.01) |
| H01L 21/3213 | (2006.01) |
| H01L 21/02 | (2006.01) |
| H01L 21/3065 | (2006.01) |

(52) U.S. Cl.
CPC ........ *H01L 21/31138* (2013.01); *G03F 7/427* (2013.01); *H01L 21/0234* (2013.01); *H01L 21/02315* (2013.01); *H01L 21/3065* (2013.01); *H01L 21/31127* (2013.01); *H01L 21/32136* (2013.01)

(58) Field of Classification Search
None
See application file for complete search history.

(56) References Cited

U.S. PATENT DOCUMENTS

| 7,575,007 B2* | 8/2009 | Tang ................. H01J 37/32862 134/1.1 |
| 2004/0237997 A1* | 12/2004 | Rui .......................... B08B 3/08 134/1.1 |
| 2005/0106875 A1* | 5/2005 | Kubota ............. H01L 21/31116 438/689 |
| 2008/0083609 A1* | 4/2008 | Shao ................. H01J 37/32357 204/164 |
| 2008/0132078 A1 | 6/2008 | Yamazaki |
| 2013/0048606 A1* | 2/2013 | Mao .......................... C23F 4/00 216/67 |

(Continued)

FOREIGN PATENT DOCUMENTS

| JP | 2006-73722 A | 3/2006 |
| JP | 2009-212333 A | 9/2009 |

(Continued)

*Primary Examiner* — Stephanie P Duclair
(74) *Attorney, Agent, or Firm* — Weihrouch IP

(57) ABSTRACT

A plasma processing method includes a substrate processing step of performing predetermined processing on a target substrate loaded into a chamber by using plasma of a hydrogen-containing gas and unloading the processed substrate from the chamber; and an in-chamber processing step of processing surfaces of components in the chamber by plasma of an oxygen-containing gas after the substrate processing step is performed at least once. The substrate processing step is performed again at least once after the in-chamber processing step.

11 Claims, 12 Drawing Sheets

(56) References Cited

U.S. PATENT DOCUMENTS

2016/0104648 A1\* 4/2016 Park .................. H01J 37/32119
438/9

FOREIGN PATENT DOCUMENTS

| JP | 2011-003823 A | 1/2011 |
|----|---------------|--------|
| JP | 2013-161912 A | 8/2013 |
| JP | 2016-111033 A | 6/2016 |

\* cited by examiner

FIG.4

| POSITION | THICKNESS | DIFFERENCE FROM REFERENCE VALUE(mm) |
|---|---|---|
| (1) | 39.9277 | −0.03115 |
| (2) | 39.9735 | +0.01465 |
| (3) | 39.9906 | +0.03175 |
| (4) | 39.9466 | −0.01225 |
| (5) | 39.9726 | +0.01405 |
| (6) | 39.9906 | +0.03175 |
| (7) | 39.9456 | −0.01325 |
| (8) | 39.9715 | +0.01265 |
| (9) | 39.992 | +0.033115 |
| (10) | 39.9403 | −0.01855 |
| (11) | 39.9726 | +0.01375 |
| (12) | 39.9943 | +0.03545 |
| (13) | 39.9719 | +0.01305 |
| (14) | 39.9722 | +0.01335 |
| (15) | 39.9955 | +0.03665 |
| (16) | 39.9638 | +0.00495 |
| (17) | 39.972 | +0.01315 |
| (18) | 39.9949 | +0.03605 |
| (19) | 39.9389 | −0.01995 |
| (20) | 39.9723 | +0.01345 |
| (21) | 39.9934 | +0.03455 |
| (22) | 39.9242 | −0.03465 |
| (23) | 39.9722 | +0.01335 |
| (24) | 39.9918 | +0.03295 |
| (25) | 39.9831 | +0.02425 |
| (26) | 39.9529 | REFERENCE VALUE |
| (27) | 39.9538 | |
| (28) | 39.9578 | |
| (29) | 39.9614 | |
| (30) | 39.9628 | |
| (31) | 39.9625 | |
| (32) | 39.9599 | |
| (33) | 39.9558 | |

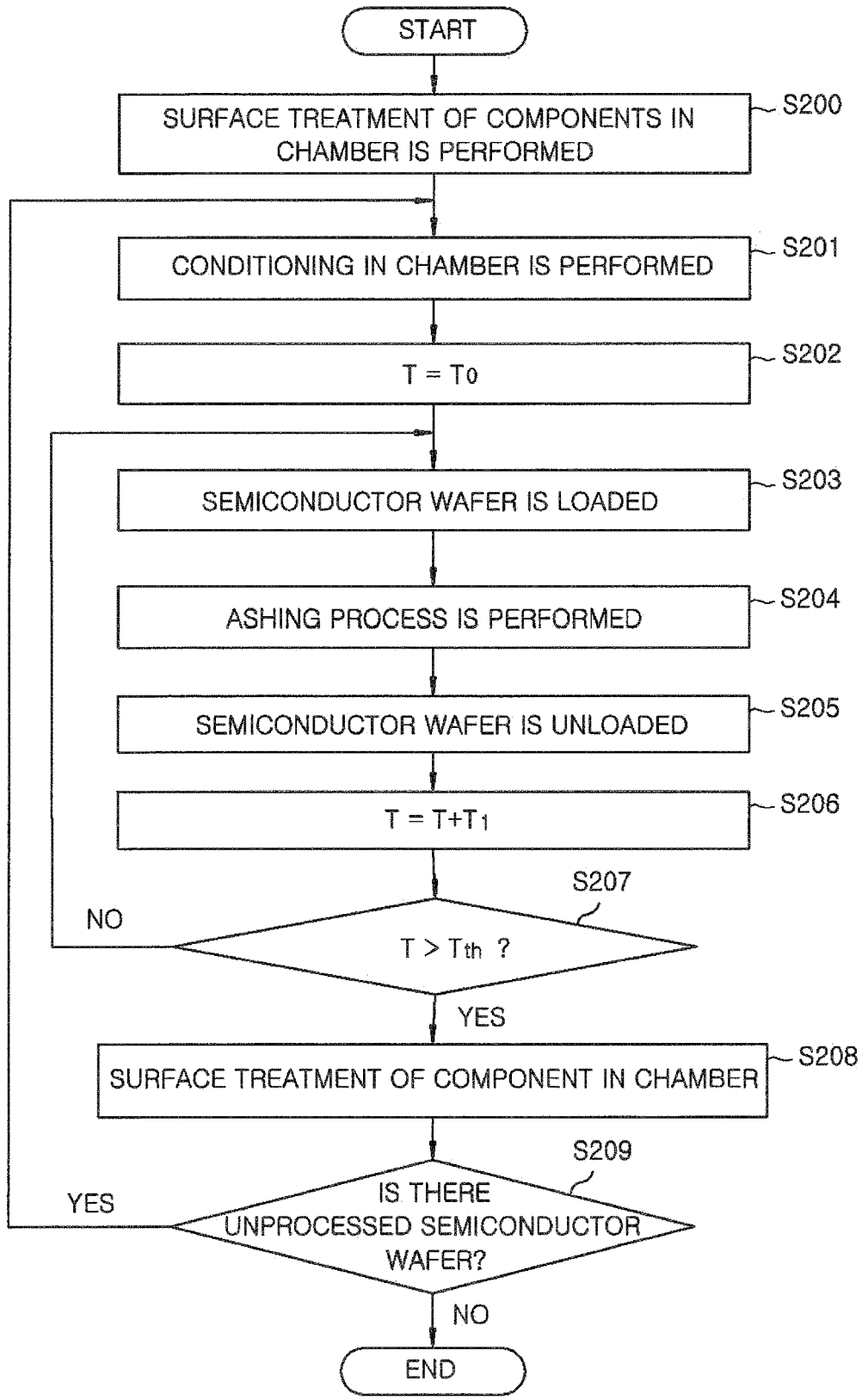

FIG. 10

| | COMPARATIVE EXAMPLE | CONDITION 1 | CONDITION 2 | CONDITION 3 | CONDITION 4 | CONDITION 5 | CONDITION 6 |
|---|---|---|---|---|---|---|---|
| RATIO | 0% | 1% | 6% | 10% | 13% | 20% | 25% |
| T1 | 120 sec | 120 sec | 120 sec | 120 sec | 240 sec | 60 sec | 120 sec |
| O2 PROCESSING | NO | per 25 wafers | per 25 wafers | per 25 wafers | per 1 wafer | per 25 wafers | per 1 wafer |
| T2 | — | 30 sec | 180 sec | 300 sec | 30 sec | 300 sec | 30 sec |
| THICKNESS OF DEPOSIT | 113.0 nm | 21.0 nm | 15.6 nm | 16.7 nm | 12.6 nm | 15.6 nm | 8.9 nm |

PLASMA PROCESSING METHOD AND PLASMA PROCESSING APPARATUS

CROSS-REFERENCE TO RELATED APPLICATIONS

This application claims priority to Japanese Patent Application No. 2017-127826 filed on Jun. 29, 2017, the entire contents of which are incorporated herein by reference.

FIELD OF THE INVENTION

The present disclosure relates to a plasma processing method and a plasma processing apparatus.

BACKGROUND OF THE INVENTION

In manufacturing electronic devices such as semiconductor devices and the like, after processing of a target substrate, a so-called ashing process in which an organic material adhered to a surface of the target substrate is removed may be performed. In the ashing process, generally, plasma of oxygen gas is generated in a plasma processing apparatus, and an organic material is removed from the target substrate by the plasma of the oxygen gas.

However, when the target substrate includes, e.g., a low-k dielectric film, a metal layer or the like which needs to avoid oxidation, oxygen gas cannot be used as an ashing gas. Therefore, it is suggested to perform an ashing process using, e.g., hydrogen gas or $H_2O$ gas, instead of oxygen gas (see, e.g., Japanese Patent Application Publication Nos. 2016-111033 and 2006-073722).

In the ashing process using hydrogen gas or $H_2O$ gas, a long period of time is required in removing an organic material, compared to the ashing process using oxygen gas. Therefore, in the ashing process using $H_2O$ gas, the duration of the ashing process may be shortened by increasing a power of the plasma. In addition, components in the chamber may be made of quartz in order to reduce influence of heat in the case of increasing the power of the plasma.

However, when plasma of hydrogen gas or $H_2O$ gas is generated in the chamber where components made of quartz that is a silicon oxide are provided, surfaces of the components made of quartz deteriorate by consumption or reduction by the plasma. Therefore, processing characteristics may change or particles may be generated in the chamber. Accordingly, it is difficult to suppress the generation of particles due to the ashing process performed on the target substrate including a low-k film, a metal layer or the like which needs to avoid oxidation.

SUMMARY OF THE INVENTION

In accordance with an aspect, there is provided a plasma processing method including a substrate processing step and an in-chamber processing step. In the substrate processing step, predetermined processing is performed on a target substrate loaded into a chamber by using plasma of a hydrogen-containing gas and unloading the processed substrate from the chamber. In the in-chamber processing step, surfaces of components in the chamber is processed by plasma of an oxygen-containing gas after the substrate processing step is performed at least once. The substrate processing step is performed again at least once after the in-chamber processing step.

In accordance with another aspect, there is provided a plasma processing apparatus including: a chamber; a gas supply unit configured to supply a gas into the chamber; a plasma generation unit configured to generate plasma of the gas supplied into the chamber; and a control unit configured to control the gas supply unit and the plasma generation unit. The control unit performs a substrate processing step of performing predetermined processing on a target substrate loaded into the chamber by using plasma of a hydrogen-containing gas and unloading the processed substrate from the chamber; and an in-chamber processing step of processing a surface of a component in the chamber by plasma of an oxygen-containing gas after the substrate processing step is performed at least once. The substrate processing step is performed again at least once after the in-chamber processing step.

BRIEF DESCRIPTION OF THE DRAWINGS

The objects and features of the present disclosure will become apparent from the following description of embodiments, given in conjunction with the accompanying drawings, in which:

FIG. 4 shows examples of thicknesses measured at the respective positions of the upper ceiling plate;

FIG. 8 is a flowchart showing an example of plasma processing in a test example;

FIG. 10 shows an example of a test result obtained by measuring a thickness of deposits while varying a ratio of the accumulated time of the $H_2$ plasma processing and processing time of $O_2$ plasma processing;

DETAILED DESCRIPTION OF THE EMBODIMENTS

Figure 1:
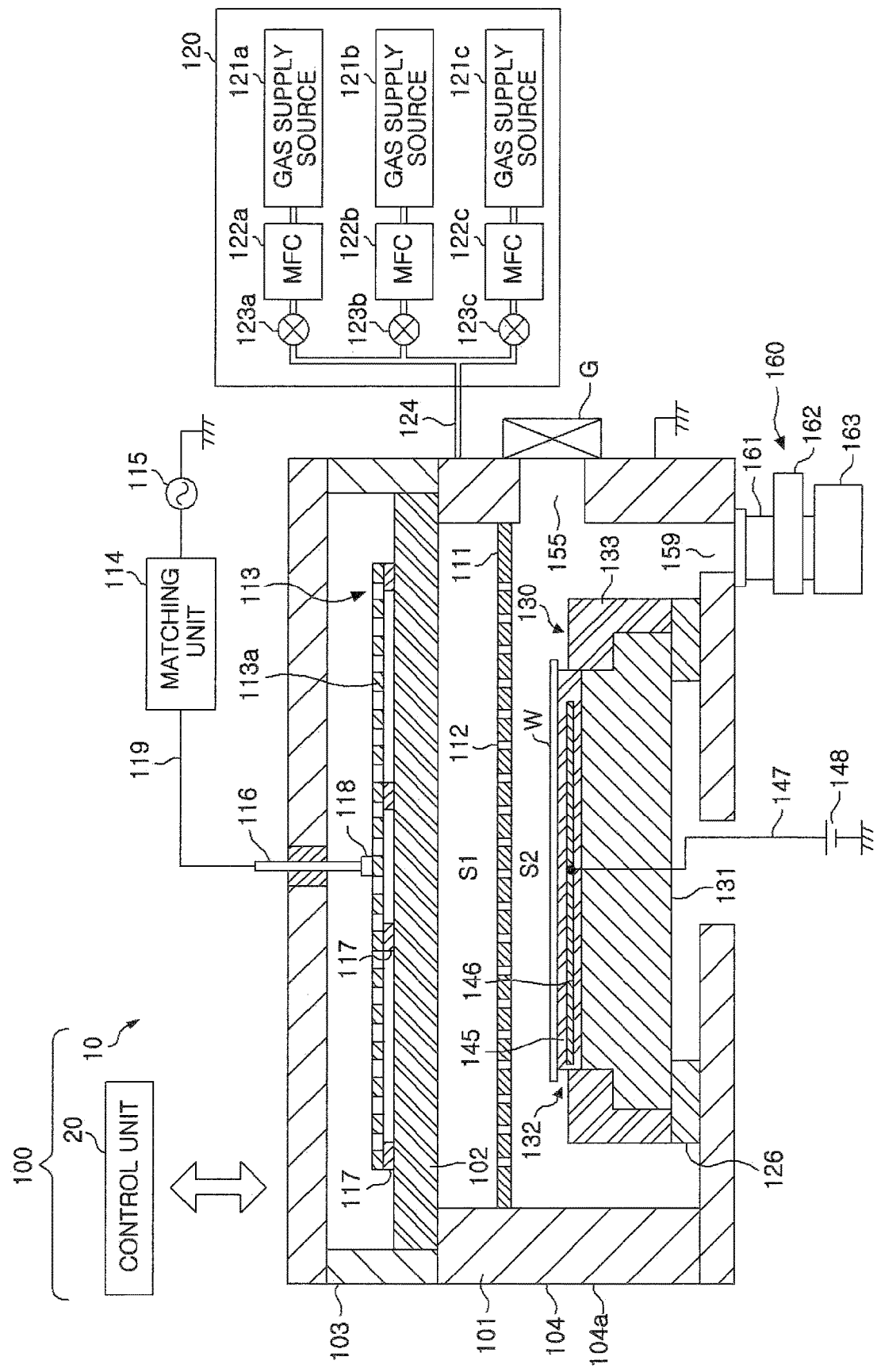
FIG. 1 shows an example of a plasma processing apparatus.

In one embodiment, a plasma processing method includes a substrate processing step and an in-chamber processing step. In the substrate processing step, predetermined processing is performed on a target substrate loaded into a chamber by using plasma of a hydrogen-containing gas and unloading the processed substrate from the chamber. In the in-chamber processing step, surfaces of components in the chamber is processed by plasma of an oxygen-containing gas after the substrate processing step is performed at least once. The substrate processing step is performed again at least once after the in-chamber processing step.

In one embodiment, an organic material may be adhered to a surface of the target substrate, and in the substrate processing step, the organic material adhered to the surface of the target substrate may be removed by using the plasma of the hydrogen-containing gas.

In one embodiment, one or more substrate processing steps and the in-chamber processing step may be alternately performed, and the plasma processing method may further include: a preparation step of preparing plasma of a hydrogen-containing gas in the chamber after the in-chamber processing step and before the next one or more the substrate processing steps.

In one embodiment, a ratio of a processing time of one in-chamber processing step to an accumulated time of the predetermined processing performed by using the plasma of the hydrogen-containing gas in the substrate processing step performed between the in-chamber processing step and the next in-chamber processing step may be 20% or more.

In one embodiment, an accumulated time of the predetermined processing performed by using the plasma of the hydrogen-containing gas in the substrate processing step performed between the in-chamber processing step and the next in-chamber processing step may be 1500 sec or less, and a processing time of the in-chamber processing time is 300 sec or more.

In one embodiment, the in-chamber processing step may be further performed before the initial substrate processing step.

In one embodiment, the hydrogen-containing gas may contain at least one of $H_2$ gas and $H_2O$ gas.

In one embodiment, the oxygen-containing gas may contain at least one of $O_2$ gas, CO gas, $CO_2$ gas, and $O_3$ gas.

In one embodiment, a plasma processing apparatus includes: a chamber; a gas supply unit configured to supply a gas into the chamber; a plasma generation unit configured to generate plasma of the gas supplied into the chamber; and a control unit configured to control the gas supply unit and the plasma generation unit, wherein the control unit performs: a substrate processing step of performing predetermined processing on a target substrate loaded into the chamber by using plasma of a hydrogen-containing gas and unloading the processed substrate from the chamber; and an in-chamber processing step of processing a surface of a component in the chamber by plasma of an oxygen-containing gas after the substrate processing step is performed at least once, wherein the substrate processing step is performed again at least once after the in-chamber processing step.

Hereinafter, embodiments of a plasma processing method and a plasma processing apparatus of the present disclosure will be described in detail with reference to the accompanying drawings. The plasma processing method and the plasma processing apparatus of the present disclosure are not limited by the following embodiments.

Embodiments (Configuration of Plasma Processing Apparatus 100)

FIG. 1 shows an example of a plasma processing apparatus 100. The plasma processing apparatus 100 includes a main body 10 and a control unit 20. The plasma processing apparatus 100 of the present embodiment performs an ashing process using an ICP (Inductively Coupled Plasma) on an organic film formed on a semiconductor wafer W as an example of a target substrate. In the present embodiment, a metal layer serving as, e.g., a wiring, is formed on the semiconductor wafer W.

The main body 10 includes an airtight chamber 101 having a substantially cylindrical shape and made of aluminum having an anodically oxidized inner wall surface. The chamber 101 is grounded. The chamber 101 is partitioned into an upper part and a lower part by an upper ceiling plate 102. At the upper side of the upper ceiling plate 102, there is provided an antenna chamber 103 in which an antenna 113 is accommodated. At the lower side of the upper ceiling plate 102, there is provided a processing chamber 104 in which plasma is generated. In the present embodiment, the upper ceiling plate 102 is made of quartz and forms a ceiling wall of the processing chamber 104. The upper ceiling plate 102 may be made of ceramic such as $Al_2O_3$ or the like.

An ion trap 111 having a plate shape and made of quartz is provided below the upper ceiling plate 102. The ion trap 111 divides a space in the processing chamber 104 into an upper space S1 and a lower space S2. The ion trap 111 suppresses inflow of ions in the plasma generated in the space S1 into the space S2. A plurality of through-holes 112 is formed through the ion trap 111 in a thickness direction thereof. Electrons or radicals in the plasma generated in the space S1 may flow into the space S2 through the through-holes 112.

Provided at a sidewall 104a of the processing chamber 104 is a gas supply line 124 having one end communicating with the space S1 and the other end communicating with a gas supply mechanism 120. A gas supplied from the gas supply mechanism 120 is supplied into the space S1 through the gas supply line 124. The gas supply mechanism 120 includes gas supply sources 121a to 121c, mass flow controllers (MFCs) 122a to 122c, and valves 123a to 123c. The gas supply mechanism 120 is an example of a gas supply unit.

The MFC 122a is connected to the gas supply source 121a for supplying a hydrogen-containing gas and controls a flow rate of the hydrogen-containing gas supplied from the gas supply source 121a. In the present embodiment, the gas supply source 121a supplies, e.g., $H_2$ gas. The valve 123a controls supply of the hydrogen-containing gas at a flow rate controlled by the MFC 122a to the gas supply line 124 and stop of the supply.

The MFC 122b is connected to the gas supply source 121b for supplying an oxygen-containing gas and controls a flow rate of the oxygen-containing gas supplied from the gas supply source 121b. In the present embodiment, the gas supply source 121b supplies, e.g., $O_2$ gas. The valve 123b controls supply of the oxygen-containing gas at a flow rate controlled by the MFC 122b to the gas supply line 124 and stop of the supply.

The MFC 122c is connected to the gas supply source 121c for supplying a rare gas and controls a flow rate of the rare gas supplied from the gas supply source 121c. In the present embodiment, the gas supply source 121c supplies, e.g., Ar gas. The valve 123c controls supply of the rare gas at a flow rate controlled by the MFC 122c to the gas supply line 124 and stop of the supply.

The antenna 113 is provided in the antenna chamber 103. The antenna 113 has an antenna line 113a made of a highly conductive metal such as copper, aluminum, or the like. The antenna line 113a is formed in an arbitrary shape such as an annular shape, a spiral shape, or the like. The antenna 113 is separated from the upper ceiling plate 102 by a spacer 117 made of an insulating material.

One end of a power feed member 116 extending to a position above the antenna chamber 103 is connected to a terminal 118 of the antenna line 113a. One end of a power feed line 119 is connected to the other end of the power feed member 116. A high frequency power supply 115 is connected to the other end of the power feed line 119 through a matching unit 114. The high frequency power supply 115 supplies a high frequency power having a frequency of, e.g., 13.56 MHz, to the antenna 113 through the matching unit 114, the power feed line 119, the power feed member 116, and the terminal 118. Accordingly, an induction electric field is generated in the space S1 of the processing chamber 104 which is positioned below the antenna 113, and the gas supplied from the gas supply line 124 is converted into plasma by the induction electric field to generate an inductively coupled plasma in the space S1. The antenna 113 is an example of a plasma generation unit.

A mounting table 130 for mounting thereon a semiconductor wafer W is provided on a bottom wall of the processing chamber 104 through a spacer 126 made of an insulating material. The mounting table 130 includes a base 131 provided on the spacer 126, an electrostatic chuck 132 provided on the base 131, and a protection member 133 made of an insulating material and covering sidewalls of the base 131 and the electrostatic chuck 132. The base 131 and the electrostatic chuck 132 have a circular shape corresponding to the shape of the semiconductor wafer W. The entire mounting table 130 is formed in a cylindrical shape. The spacer 126 and the protection member 133 are made of an insulating ceramic such as alumina or the like.

The electrostatic chuck 132 is provided on the upper surface of the base 131. The electrostatic chuck 132 includes a dielectric layer 145 made of a thermally sprayed ceramic film and an electrode 146 buried in the dielectric layer 145. The electrode 146 may have various shapes such as a plate shape, a film shape, a lattice shape, a net shape, and the like. A DC power supply 148 is connected to the electrode 146 through a power feed line 147, and a DC voltage supplied from a DC power supply 148 is applied to the electrode 146. The DC voltage applied from the DC power supply 148 to the electrode 146 through the power feed line 147 is controlled by a switch (not shown). An electrostatic attraction force such as Coulomb force or Johnsen-Rahbek force is generated by the DC voltage applied from the DC power source 148 to the electrode 146, and the semiconductor wafer W mounted on the electrostatic chuck 132 is attracted to and held on the upper surface of the electrostatic chuck 132. The dielectric layer 145 of the electrostatic chuck 132 may be made of $Al_2O_3$, $Y_2O_3$ or the like.

A temperature control unit and a temperature sensor (both not shown) for controlling a temperature of the semiconductor wafer W are provided in the base 131 of the mounting table 130. A temperature control unit and a temperature sensor (both not shown) for controlling a temperature of the gas in the processing chamber 104 are provided in the sidewall 104a of the processing chamber 104. The main body 10 is provided with a heat transfer gas supply unit (not shown) for supplying to a gap between the semiconductor wafer W and the mounting table 130 a heat transfer gas, e.g., He gas, for controlling the amount of heat transferred between the semiconductor wafer W and the mounting table 130 in a state where the semiconductor wafer W is mounted on the mounting table 130. A plurality of elevating pins (not shown) for delivering the semiconductor wafer W is provided on the mounting table 130 to protrude beyond and retract below the upper surface of the electrostatic chuck 132.

A loading/unloading port 155 for loading/unloading the semiconductor wafer W into/from the processing chamber 104 is provided on the sidewall 104a of the processing chamber 104. The loading/unloading port 155 can be opened/closed by a gate valve G. By controlling the gate valve G to be opened, the semiconductor wafer W can be loaded and unloaded through the loading/unloading port 155.

A gas exhaust port 159 is formed at the bottom wall of the processing chamber 104, and a gas exhaust unit 160 is provided at the gas exhaust port 159. The gas exhaust unit 160 includes a gas exhaust line 161 connected to the gas exhaust port 159, an APC (Auto Pressure Controller) valve 162 for controlling a pressure in the processing chamber 104 by controlling an opening degree of the gas exhaust line 161, and a vacuum pump 163 for exhausting the processing chamber 104 through the gas exhaust line 161. The processing chamber 104 is exhausted by the vacuum pump 163, and the pressure in the processing chamber 104 is maintained at a predetermined vacuum level by controlling the opening degree of the APC valve 162 during an etching process using plasma.

The control unit 20 includes a memory such as a ROM (Read Only Memory), a RAM (Random Access Memory) or the like, and a processor such as a CPU (Central Processing Unit) or the like. The processor in the control unit 20 controls the respective components of the main body 10 by reading out and executing the program stored in the memory in the control unit 20. Specific processes performed by the control unit 20 will be described later.

(Plasma Processing in Comparative Example)

Figure 2:
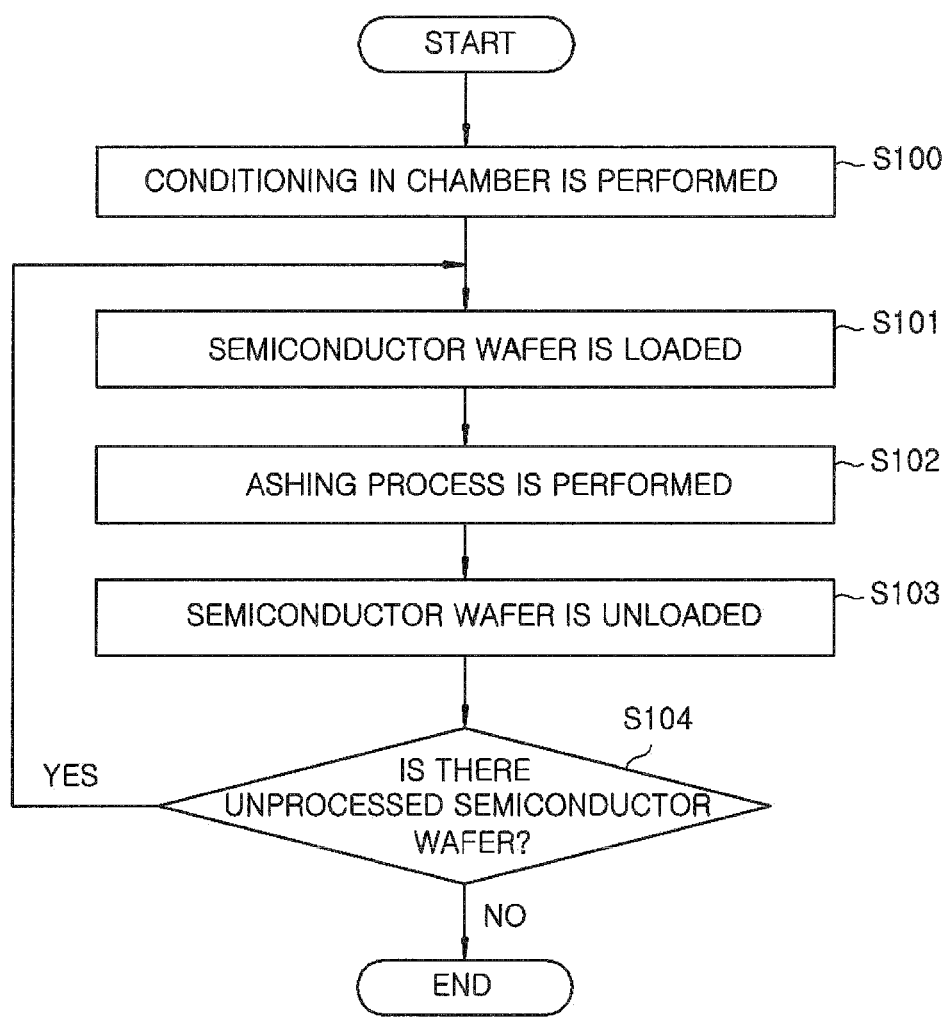
FIG. 2 is a flowchart showing an example of plasma processing in a comparative example.

Here, the plasma processing in a comparative example will be described. FIG. 2 is a flowchart showing an example of the plasma processing in the comparative example. Hereinafter, a case in which the plasma processing in the comparative example is performed by using the plasma processing apparatus 100 shown in FIG. 1 will be described.

First, conditioning in the chamber 101 is performed (S100). In the step S100, the environment in the chamber 101 such as a temperature or the like is made to be close to that in an ashing process to be described later by performing the same process as the ashing process to be described later in a state where the semiconductor wafer W is not loaded into the chamber 101.

Specifically, the control unit 20 controls the APC valve 162 and the vacuum pump 163 to exhaust the processing chamber 104 to a predetermined vacuum level (e.g., 2.5 Torr). Then, the control unit 20 controls the valve 123a to be opened and controls the MFC 122a to supply $H_2$ gas at a predetermined flow rate (e.g., 500 sccm) from the gas supply source 121a. Further, the control unit 20 controls the valve 123c to be opened and controls the MFC 122c to supply Ar gas at a predetermined flow rate (e.g., 6200 sccm) from the gas supply source 121c. Accordingly, a gaseous mixture of $H_2$ gas and Ar gas is supplied to the space S1 of the processing chamber 104 through the gas supply line 124. Then, the control unit 20 controls the temperature control unit (not shown) to control a temperature in the processing chamber 104 to a predetermined level by controlling a temperature of the base 131 or the sidewall 104a of the processing chamber 104 to a predetermined level.

Then, the control unit 20 controls the high frequency power supply 115 to apply a high frequency power having a frequency of, e.g., 13.56 MHz, to the antenna 113 at a predetermined power level (e.g., 3000 W). Therefore, a magnetic field is generated in the processing chamber 104 below the antenna 113 through the upper ceiling plate 102, and an induction electric field is generated in the processing chamber 104 by the magnetic field thus generated. Accordingly, electrons in the space S1 of the processing chamber 104 are accelerated by the induced electric field, and the accelerated electrons collide with molecules or atoms of $H_2$ gas supplied into the space S1, thereby generating an inductively coupled plasma. Hereinafter, plasma of the gaseous mixture of $H_2$ gas and Ar gas is referred to as "$H_2$ plasma".

In the step S100, the control unit 20 generates the $H_2$ plasma for a predetermined period of time (e.g., 120 sec). The period of time in which the $H_2$ plasma is generated in the step S100 may be shorter than or equal to that of the ashing process to be described later in a step S102. Then, the control unit 20 controls the valves 123a and 123c to be closed and exhausts $H_2$ gas and Ar gas in the processing chamber 104.

Next, the gate valve G is opened, and the semiconductor wafer W is loaded into the processing chamber 104 (S101). Then, the semiconductor wafer W is mounted on the electrostatic chuck 132, and the gate valve G is closed. Then, the control unit 20 controls the switch (not shown) to apply a DC voltage from the DC power supply 148 to the electrode 146 through the power feed line 147. Accordingly, the semiconductor wafer W is attracted to and held on the upper surface of the electrostatic chuck 132. Then, the control unit 20 controls the temperature control unit to control a temperature of the semiconductor wafer W to a predetermined level.

Next, an ashing process for removing an organic material on the semiconductor wafer W is performed on the semiconductor wafer W on the electrostatic chuck 132 (S102). Since the ashing process in the step S102 is the same as the conditioning in the step S100, detailed description thereof will be omitted.

After the ashing process in the step S102 is performed for a predetermined period of time (e.g., 120 sec), the control unit 20 controls the valves 123a and 123c to be closed and exhausts $H_2$ gas and Ar gas in the process chamber 104. Then, the gate valve G is opened, and the semiconductor wafer W is unloaded from the processing chamber 104 (S103). Then, the control unit 20 determines whether or not there is an unprocessed semiconductor wafer W (S104). When there is an unprocessed semiconductor wafer W (S104: Yes), the processing in the step S101 is executed again. On the other hand, when there is no unprocessed semiconductor wafer W (S104: No), i.e., when the ashing process for all the semiconductor wafers W as processing targets is completed, the processing shown in the flowchart is completed.

(State of Upper Ceiling Plate 102 in Comparative Example)

Figure 3:
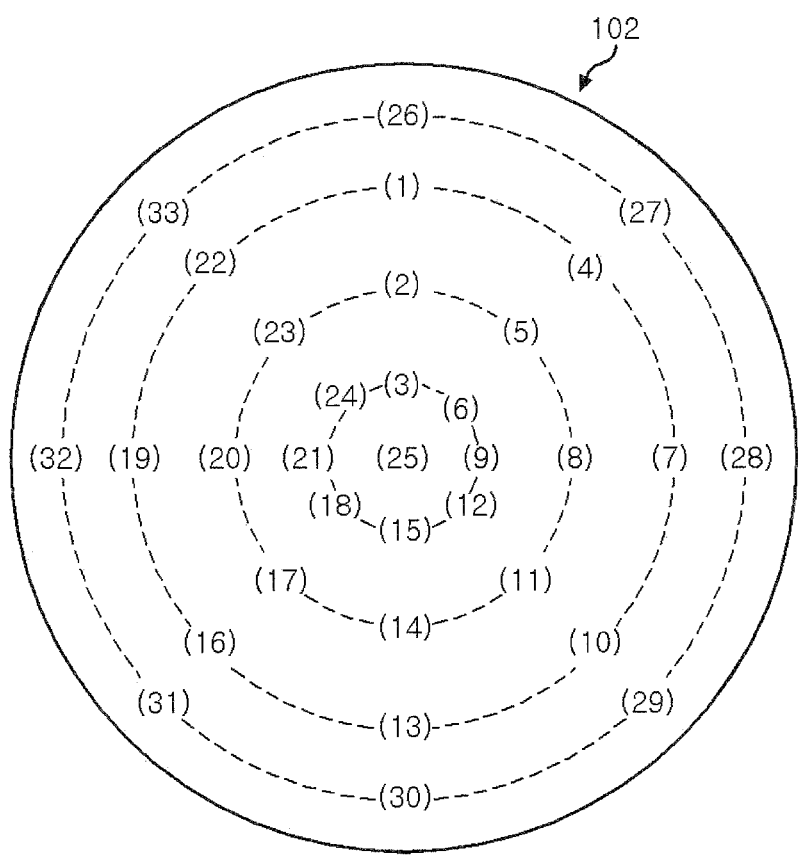
FIG. 3 shows positions of an upper ceiling plate at which the thickness of the upper ceiling plate has been measured.

Next, a thickness of the upper ceiling plate 102 after the execution of the ashing process in the comparative example was measured. In the comparative example, the ashing process using an $H_2$ plasma was performed on about 10,000 semiconductor wafers W. FIG. 3 shows positions of the upper ceiling plate 102 at which the thickness of the upper ceiling plate 102 has been measured. FIG. 3 shows the lower surface of the upper ceiling plate 102 (facing the space S1). For example, as shown in FIG. 3, the thickness of the upper ceiling plate 102 was measured at 25 positions (1) to (25) after the ashing process using an $H_2$ plasma was performed on about 10,000 semiconductor wafers W. The positions (26) to (33) in FIG. 3 are in contact with an upper end of the sidewall 104a of the processing chamber 104 (see FIG. 1) and are not exposed to the $H_2$ plasma in the space S1.

FIG. 4 shows examples of thicknesses measured at the respective positions of the upper ceiling plate 102. "Difference from reference value" shown in FIG. 4 indicates a difference between a reference value that is an average of the thicknesses of the upper ceiling plate 102 at the positions (26) to (33) and the thickness at each of the positions (1) to (25). At the position of the upper ceiling plate 102 where the surface is etched, the "difference from the reference value" becomes a negative value. At the position of the upper ceiling plate 102 where reaction by-products (hereinafter, referred to as "deposits") are deposited, the "difference from the reference value" becomes a positive value.

For example, as shown in FIG. 4, the difference from the reference value at each of the positions (1), (4), (7), (10), (19) and (22) is a negative value, which indicates that the surface of the upper ceiling plate 102 at those positions is etched. The difference from the reference value at each of the positions (3), (6), (9), (12), (15), (18), (21), and (24) is a positive value, which indicates that the deposits are deposited on the surface of the upper ceiling plate 102. The difference from the reference value at each of the positions (3), (6), (9), (12), (15), (18), (21) and (24) is greater than that at the other positions, and the surface was discolored brown due to the deposition of the deposits.

Figure 5:
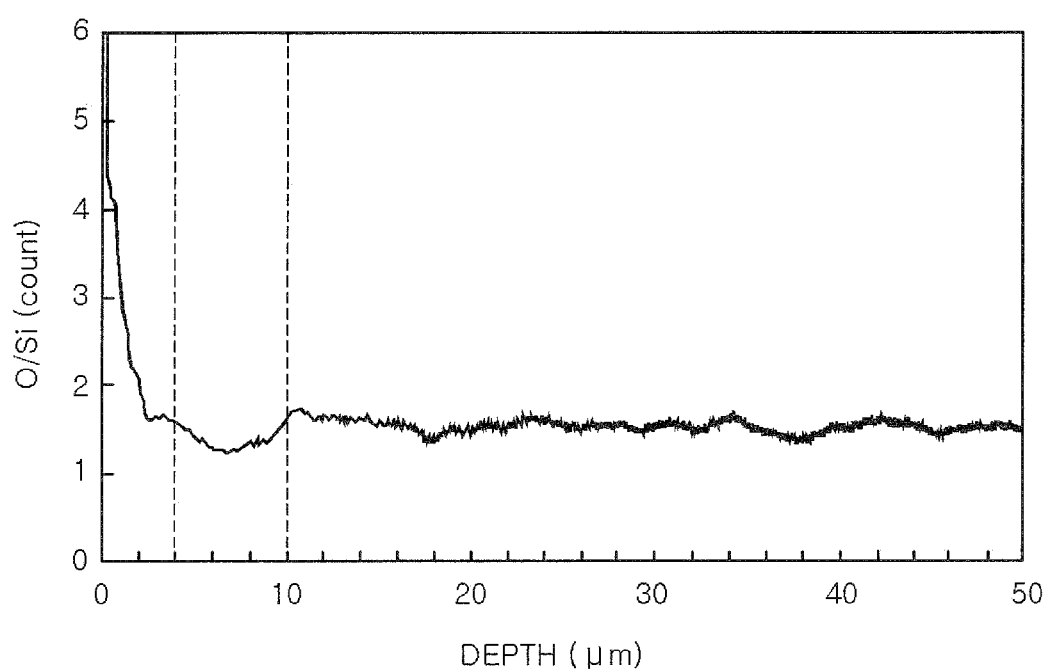
FIG. 5 shows an example of a measurement result of a ratio of oxygen elements to silicon elements in a surface layer of the upper ceiling plate.

Next, the ratio of oxygen elements to silicon elements on the surface of the upper ceiling plate 102 which has been discolored by the deposits was measured by using an EPMA (Electron Probe Micro Analyzer). FIG. 5 shows an example of a measurement result of the ratio of the oxygen elements to the silicon elements in the surface layer of the upper ceiling plate 102. In FIG. 5, measured values in a depth range from 0 μm to 2 μm are obtained from a space, and the position of the depth of 2 μm is the position of the surface of the upper ceiling plate 102.

For example, referring to FIG. 5, the ratio of the oxygen elements to the silicon elements was lower in the depth range from 2 μm to 10 μm than in the depth range of 10 μm or more. In other words, in the depth range from 2 μm to 10 μm, deposits different from the base material of the upper ceiling plate 102 are deposited, and the ratio of the oxygen elements to the silicon elements in the deposits is lower than that in the base material of the upper ceiling plate 102.

FIGS. 6A to 6D explain the above by using a model. FIGS. 6A to 6D schematically show an example of a process in which particles are generated by an ashing process using an $H_2$ plasma. In FIGS. 6A to 6D, a hatched circle indicates a silicon (Si) element; a white circle indicates an oxygen (O) element; and a black circle indicates a hydrogen (H) atom or a hydrogen radical.

Figure 6A:
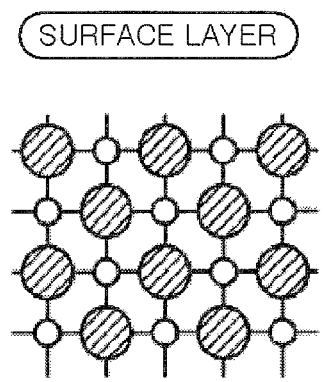
FIGS. 6A to 6D schematically show an example of a process in which particles are generated by an ashing process using an $H_2$ plasma.
Figure 6B:
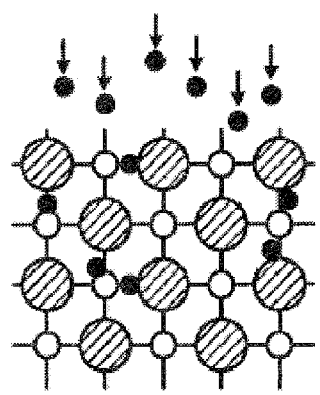

For example, as shown in FIG. 6A, in an initial state, the base material of the upper ceiling plate 102 has a crystal structure in which Si elements and O elements are bonded. When the ashing process is performed by using an $H_2$ plasma in that state, the surface of the upper ceiling plate 102 is exposed to the $H_2$ plasma. Then, as shown in FIG. 6B, for example, H radicals contained in the $H_2$ plasma enter the crystal of the upper ceiling plate 102 from the surface of the upper ceiling plate 102.

Figure 6C:
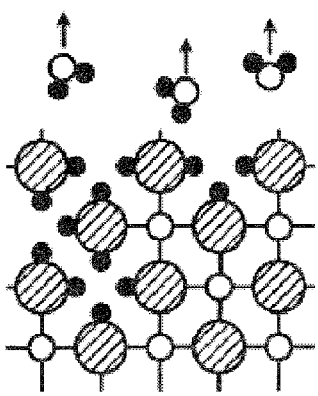
Figure 6D:
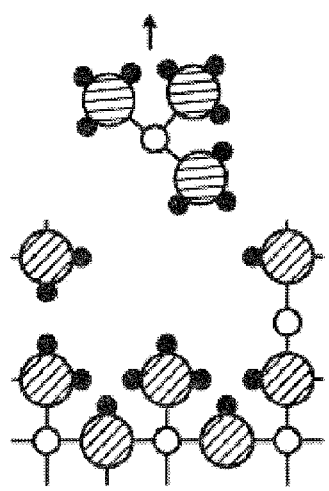

Then, as shown in FIG. 6C, for example, the H radicals that have entered the crystal of the upper ceiling plate 102 are bonded with Si elements and O elements in the crystal of the upper ceiling plate 102 whose bonding is cut by the reduction action of the H radicals. Then, the O elements bonded with the H radicals become water molecules ($H_2O$) and are detached from the upper ceiling plate 102. The crystal of the upper ceiling plate 102 from which the O elements have been detached becomes weak. When the ashing process using the $H_2$ plasma is repeated, the bonding is further cut by heat input from the plasma, or distortion occurs in the upper ceiling plate 102 due to thermal stress, or a part of the surface is peeled off as Si-containing particles by sputtering due to incidence of ions from the plasma, as can be seen from FIG. 6D, for example.

Accordingly, the thickness of the upper ceiling plate 102 at the position where the Si-containing material is peeled off from the surface becomes smaller than the reference value, and the thickness of the upper ceiling plate 102 at the position where the Si-containing material peeled off from other positions is deposited becomes greater than the reference value. If the thickness of the upper ceiling plate 102 is locally different, the processing characteristics such as the distribution of the plasma generated in the space S1 and the like are changed. The Si-containing material peeled off from the surface of the upper ceiling plate 102 scatters as particles in the space S1 and enters the space S2 from the through-holes 112 of the ion trap 111. Then, the particles that have entered the space S2 are adhered to the semiconductor wafer W, which may cause deterioration of the characteristics of the semiconductor wafer W.

Therefore, in the present embodiment, the surface of the upper ceiling plate 102 is treated with an $O_2$ plasma in order to suppress the generation of particles due to the ashing process using an $H_2$ plasma. FIGS. 7A to 7E schematically explain an example of a process in which the number of particles is reduced by a process using an $O_2$ plasma after the ashing process using an $H_2$ plasma.

Figure 7A:
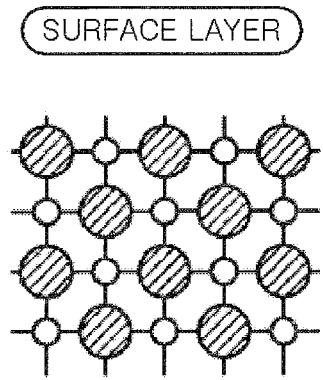
FIGS. 7A to 7E schematically explain an example of a process in which the number of particles is reduced by a process using an $O_2$ plasma after the ashing process using the $H_2$ plasma.
Figure 7B:
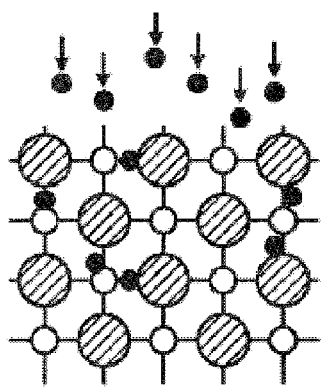
Figure 7C:
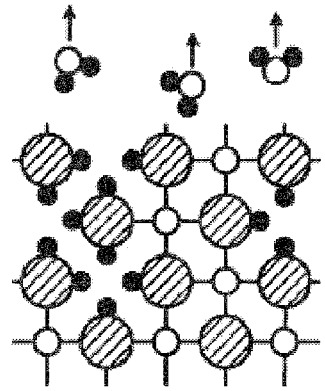

For example, when the upper ceiling plate 102 in the initial state shown in FIG. 7A is exposed to the $H_2$ plasma by the ashing process, the H radicals contained in the $H_2$ plasma enter the crystal of the upper ceiling plate 102 from the surface of the upper ceiling plate 102 as shown in FIG. 7B. Due to the H radicals that have entered the crystal of the upper ceiling plate 102, the bonding between Si elements and O elements in the crystal of the upper ceiling plate 102 is cut, and the O elements bonded with the H radicals are detached as $H_2O$ molecules from the upper ceiling plate 102 as shown in FIG. 7C. The crystal of the upper ceiling plate 102 from which the O elements have been detached becomes weak.

Figure 7D:
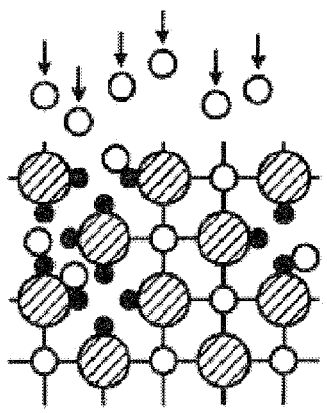

In the present embodiment, an $O_2$ plasma is generated in the space S1 of the processing chamber 104 after the ashing process using an $H_2$ plasma is performed. Accordingly, as shown in FIG. 7D, for example, O radicals in the $O_2$ plasma enter the surface of the upper ceiling plate 102 from which the O elements have been detached. The bonding between the Si elements and the H elements in the crystal of the upper ceiling plate 102 is cut by an oxidizing effect of the O radicals that have entered the upper ceiling plate 102, and the O radicals are bonded with the Si elements or the H elements.

Figure 7E:
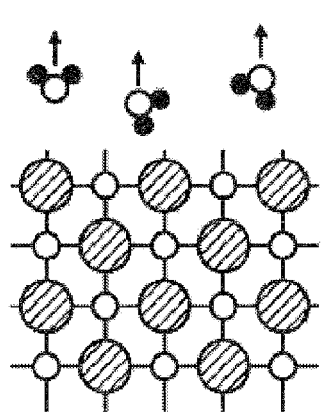

The H elements bonded with the O radicals that have entered the upper ceiling plate 102 become $H_2O$ molecules and are detached from the upper ceiling plate 102, as shown in FIG. 7E, for example. The Si elements bonded with the O radicals that have entered the upper ceiling plate 102 are oxidized again and reconstruct the crystal of $SiO_2$. Accordingly, it is possible to restore the weakened surface of the upper ceiling plate 102.

(Plasma Processing in Embodiment)

Next, an example of plasma processing in an embodiment will be described. FIG. 8 is a flowchart showing an example of the plasma processing in the embodiment.

First, the surface treatment of the components in the chamber 101 such as the upper ceiling plate 102 and the like is performed (S200). Specifically, the control unit 20 controls the APC valve 162 and the vacuum pump 163 to exhaust the processing chamber 104 to a predetermined vacuum level (e.g., 2.5 Torr). Then, the control unit 20 controls the valve 123b to be opened, and controls the MFC 122b to supply $O_2$ gas at a predetermined flow rate (e.g., 6500 sccm) from the gas supply source 121b. Accordingly, the $O_2$ gas is supplied into the space S1 of the processing chamber 104 through the gas supply line 124.

Then, the control unit 20 controls the high frequency power supply 115 to apply a high frequency power having a frequency of, e.g., 13.56 MHz, to the antenna 113 at a predetermined power level (e.g., 3000 W), and generates an $O_2$ plasma in the space S1 by an induction electric field generated in the processing chamber 104. In the step S200, the control unit 20 generates the $O_2$ plasma for a predetermined period of time (e.g., 300 sec). Therefore, the surfaces of the components in the chamber 101 which are made of quartz, such as the upper ceiling plate 102 and the like, are treated with the $O_2$ plasma. Accordingly, the H elements adhered to the surfaces of the components made of quartz, such as the upper ceiling plate 102 and the like, are removed until the processing shown in FIGS. 7A to 7E is started. The processing in the step S200 is an example of the in-chamber processing step.

Next, the conditioning in the chamber 101 is performed (S201). In the step S201, the environment in the chamber 101, such as a temperature or the like, is made to be close to that in an ashing process to be described later by performing the same process as the ashing process to be described later in a state where the semiconductor wafer W is not loaded into the chamber 101. The processing in the step S201 is an example of a preparation step. Since the conditioning in the step S201 is the same as the processing in the step S100 (see FIG. 2) in the comparative example except for the following conditions, redundant description thereof will be omitted. In other words, the conditioning in the step S201 is different from the processing in the step S100 in the comparative example in that the flow rate of $H_2$ gas is, e.g., 2000 sccm; the flow rate of Ar gas is, e.g., 9200 sccm; and the high frequency power is 2000 W.

After the $H_2$ plasma is generated for a predetermined period of time (e.g., 120 sec) in the step S201, the control unit 20 controls the valves 123a and 123c to be closed and exhausts $H_2$ gas and Ar gas in the processing chamber 104. The period of time in which the $H_2$ plasma is generated in step S201 may be shorter than or equal to that of the ashing process to be described later in a step S204.

Next, the control unit 20 initializes a variable T for measuring accumulated time of $H_2$ plasma processing to $H_2$ plasma processing time $T_0$ in the step S201 (S202). Then, the gate valve G is opened, and the semiconductor wafer W is loaded into the processing chamber 104 (S203). Then, the semiconductor wafer W is mounted on the electrostatic chuck 132, and the gate valve G is closed. Then, the control unit 20 controls the switch (not shown) to apply a DC voltage from the DC power supply 148 to the electrode 146 through the power feed line 147. Accordingly, the semiconductor wafer W is attracted to and held on the upper surface of the electrostatic chuck 132. Then, the control unit 20 controls the temperature control unit (not shown) to control the temperature of the semiconductor wafer W to a predetermined level.

Next, an ashing process for removing an organic material on the semiconductor wafer W is performed on the semiconductor wafer W mounted on the electrostatic chuck 132 (S204). Since the ashing process in the step S204 is the same as the ashing process in the step S102 (see FIG. 2) in the comparative example except for the following conditions, redundant description thereof will be omitted. In other words, the ashing process in step S204 is different from the processing in the step S102 in the comparative example in that the flow rate of $H_2$ gas is 2000 sccm; the flow rate of Ar gas is, e.g., 9200 sccm; the high frequency power is 2000 W; and the processing time is, e.g., 60 seconds. The processing in the step S204 is an example of the substrate processing step.

After the ashing process in the step S204 is performed for a predetermined period of time, the control unit 20 controls the valves 123a and 123c to be closed, and exhausts $H_2$ gas and Ar gas in the process chamber 104. Then, the gate valve G is opened, and the semiconductor wafer W is unloaded from the processing chamber 104 (S205). Then, the control unit 20 adds $H_2$ plasma processing time $T_1$ in the step S204 to the variable T (S206).

Next, the control unit 20 determines whether or not the value of the variable T is greater than a predetermined threshold value $T_{th}$ (S207). In the present embodiment, the threshold value $T_{th}$ is, e.g., 1500 sec. When the value of the variable T is smaller than or equal to the threshold value $T_{th}$ (S207: No), the processing in the step S203 is performed again.

On the other hand, when the value of the variable T is greater than the threshold value $T_{th}$ (S207: Yes), the treatment of the surfaces of the components in the chamber 101, such as the upper ceiling plate 102 and the like, is performed (S208). Since the processing in the step S208 is the same as the processing in the step S200, redundant description thereof will be omitted. The processing in the step S208 is an example of an in-chamber processing step.

Next, the control unit 20 determines whether or not there is an unprocessed semiconductor wafer W (S209). When there is an unprocessed semiconductor wafer W (S209: Yes), the processing in the step S201 is performed again. On the other hand, when there is no unprocessed semiconductor wafer W (S209: No), i.e., when the ashing process for all the semiconductor wafers W as processing targets is completed, the processing shown in the flowchart is completed.

In the present embodiment, the step S201 is executed after the steps S200 and S208. Therefore, O elements excessively adhered to the surfaces of the components in the processing chamber 104 can be removed by the $O_2$ plasma generated in the step S200 or S208. Accordingly, it is possible to suppress the adhesion of the O elements onto the semiconductor wafer W loaded into the processing chamber 104 in the step S203. As a result, contamination of the metal layer on the semiconductor wafer W by the O elements can be suppressed.

(Number of Particles on Semiconductor Wafer W)

Figure 9:
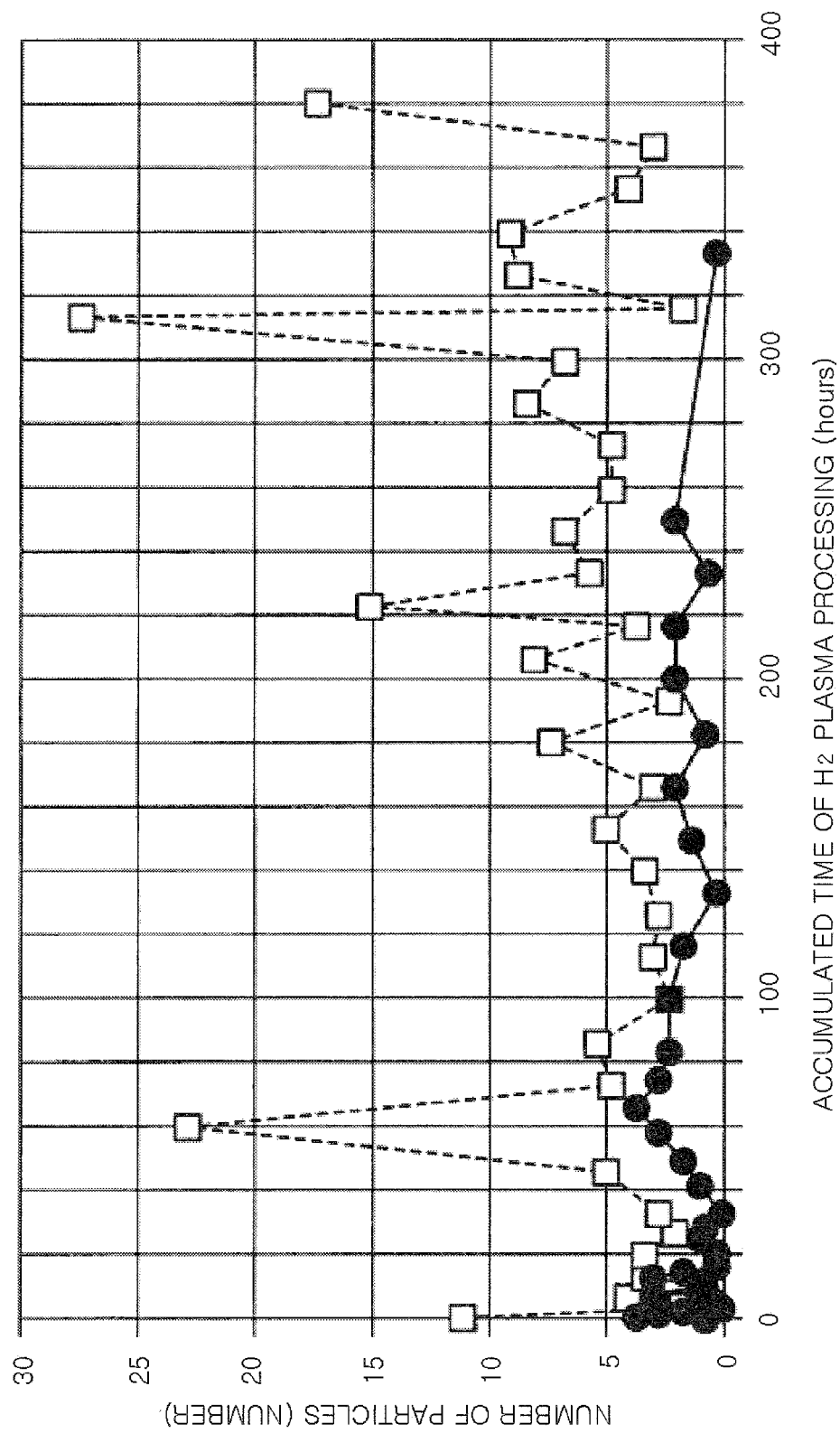
FIG. 9 shows an example of the number of particles with respect to accumulated time of $H_2$ plasma processing.

FIG. 9 shows an example of the number of particles with respect to the accumulated time of the $H_2$ plasma processing. For example, as shown in FIG. 9, the number of particles is greater in the comparative example in which the processing using an $O_2$ plasma is not performed than in the present embodiment. In the comparative example, the number of particles tends to be increased as the accumulated time of the $H_2$ plasma processing is increased.

On the other hand, the number of particles is smaller in the present embodiment in which the processing using an $O_2$ plasma is performed whenever the accumulated time of the $H_2$ plasma processing reaches a predetermined time than in the comparative example. In the present embodiment, even if the accumulated time of the $H_2$ plasma processing is increased, the number of particles is stable at a low level without being increased. Therefore, in accordance with the plasma processing method of the present embodiment, the generation of particles can be suppressed in the ashing process using an $H_2$ plasma.

(Relation Between $H_2$ Plasma Processing Time and $O_2$ Plasma Processing Time)

Next, a test was conducted on the relation between the accumulated time T of the $H_2$ plasma processing time $T_1$ and the $O_2$ plasma processing time $T_2$. The accumulated time T is the accumulated time of the $H_2$ plasma processing time $T_1$ performed between an $O_2$ plasma processing and a next $O_2$ plasma processing. The processing time $T_2$ is the processing time of single $O_2$ plasma processing performed in the step S208 shown in FIG. 8. In the following description, the ratio of the $O_2$ plasma processing time $T_2$ to the accumulated time T of the $H_2$ plasma processing time $T_1$ will be simply referred to as "ratio of processing time".

Figure 11:
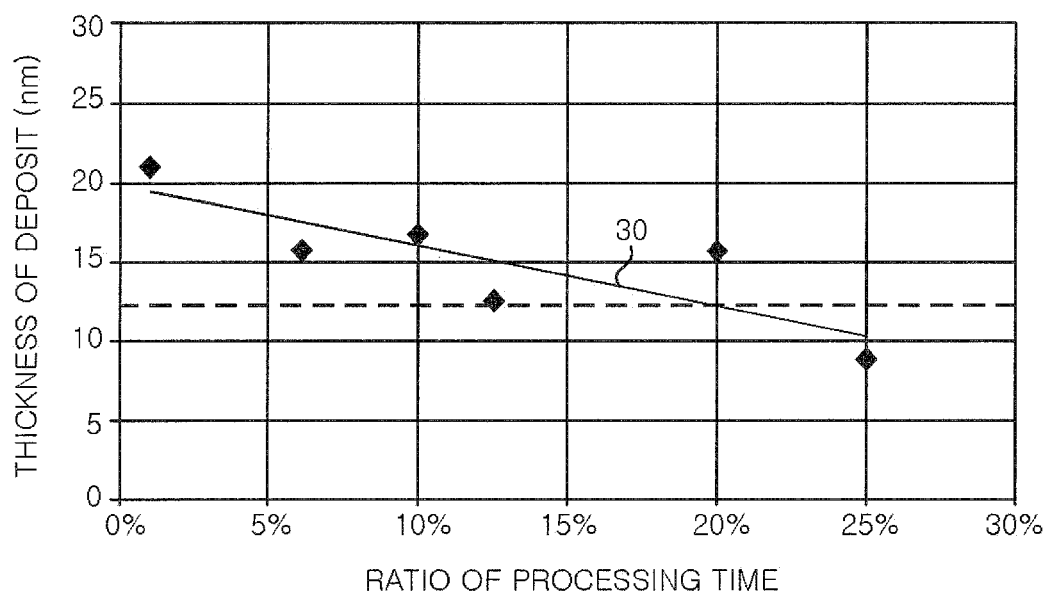
FIG. 11 is a graph showing the thickness of the deposits with respect to the ratio of the processing time.

In the test, a test piece made of $SiO_2$ was mounted on an upper surface of the ion trap 111 (facing the space S1), and an ashing process was performed on 200 semiconductor wafers W. Then, a thickness of deposits deposited on the test piece was measured. Test conditions and results are shown in FIG. 10. FIG. 10 shows an example of the test result obtained by measuring the thickness of deposits while varying the ratio of the accumulated time T of the $H_2$ plasma processing time $T_1$ to the $O_2$ plasma processing time $T_2$. FIG. 11 is a graph showing the thickness of deposits with respect to the ratio of the processing time.

For example, under a condition 1, the $H_2$ plasma processing time $T_1$ per a single semiconductor wafer W is 120 sec and the $O_2$ plasma processing is performed for every 25 semiconductor wafers W, as can be seen from FIG. 10. Therefore, the accumulated time T is calculated as follows: 120 sec×25=3000 sec. Further, under the condition 1, the single $O_2$ plasma processing time $T_2$ is 30 sec and, thus, the ratio of the $O_2$ plasma processing time $T_2$ to the accumulated time T of the $H_2$ plasma processing time $T_1$ is calculated as follows: (30 sec/3000 sec)×100=1%. This is also applied to the case of calculating the ratio under other conditions.

Referring to FIG. 10, in the comparative example in which the $O_2$ plasma processing is not performed, the thickness of deposits deposited on the test piece is 113.0 nm. On the contrary, under the conditions 1 to 6 in which the $O_2$ plasma processing is performed whenever the $H_2$ plasma processing is performed for a predetermined period of time, the thickness of deposits deposited on the test piece is considerably smaller than that in the comparative example.

Referring to FIG. 11, as indicated by an approximate straight line 30, the thickness of deposits deposited on the test piece tends to be decreased as the ratio of the processing time is increased. In FIG. 11, the thicknesses of the deposits measured under the conditions 1 to 6 are plotted, and the measurement result of the comparative example is not plotted.

The test result shown in FIG. 9 corresponds to the condition 5 shown in FIG. 10. In other words, the test result shown in FIG. 9 corresponds to the test result obtained when the ratio of the $O_2$ plasma processing time is 20% to the $H_2$ plasma processing time. Referring to FIG. 11, the thickness of deposits deposited on the test piece tends to be decreased as the ratio of the processing time is increased. The decrease in the thickness of deposits deposited on the test piece indicates the decrease in the number of particles scattering in the chamber 101. Therefore, the number of particles adhered onto the semiconductor wafer W can be further reduced by setting the ratio of the processing time to 20% or more. Accordingly, the ratio of the $O_2$ plasma processing time to the $H_2$ plasma processing time is preferably 20% or more.

In the test result shown in FIG. 9, the accumulated time T of the $H_2$ plasma processing time $T_1$ is 1500 sec, and the single $O_2$ plasma processing time $T_2$ is 300 sec. Therefore, in order to set the ratio of processing time to 20% or more, the accumulated time T of the $H_2$ plasma processing time $T_1$ is preferably 1500 sec or less, and the $O_2$ plasma processing time $T_2$ is preferably 300 sec or more.

When the upper ceiling plate 102 is exposed to an $H_2$ plasma for a long time, the hydrogen elements penetrate deeper from the surface of the upper ceiling plate 102. On the other hand, the oxygen element has a larger size than that of the hydrogen element as shown in FIGS. 7A to 7E and, thus, it is difficult for the oxygen element to penetrate deeper from the surface of the upper ceiling plate 102, compared to the hydrogen element. Therefore, in order to remove the hydrogen elements from the upper ceiling plate 102 by using the $O_2$ plasma, it is preferable that the portion where the bonding between the Si element and the O element in the crystal of the upper ceiling plate 102 is cut due to the exposure to $H_2$ plasma does not have a large depth. In other words, it is preferable to decrease a period of time in which the upper ceiling plate 102 is exposed to the $H_2$ plasma. In this case as well, the accumulated time T of the $H_2$ plasma processing time $T_1$ is preferably 1500 sec or less.

Even when the $O_2$ plasma is not used, it is possible to decrease the thickness of deposits deposited on the test piece to about 12 nm to 13 nm (indicated by a dotted line in FIG. 11) by optimizing the flow rates of Ar gas and $H_2$ gas in the $H_2$ plasma and the power applied from the high frequency power supply 115 to the antenna 113. However, in the present embodiment, it is possible to decrease the thickness of deposits, compared to the case of not using an $O_2$ plasma, by setting the ratio of the $O_2$ plasma processing time to the $H_2$ plasma processing to 25% or more, as can be seen from FIG. 11, for example.

Therefore, the ratio of the $O_2$ plasma processing time to the $H_2$ plasma processing time is more preferably 25% or more. In FIG. 11, the measurement value plotted at the position where the ratio of the processing time is 25% corresponds to the condition 6 of FIG. 10. In the condition 6 of FIG. 10, the accumulated time T of the $H_2$ plasma processing time $T_1$ is 120 sec, and the single $O_2$ plasma processing time $T_2$ is 30 sec. Therefore, in order to set the ratio of the processing time to 25% or more, the accumulated time T of the $H_2$ plasma processing time $T_1$ is preferably 120 sec or less, and the $O_2$ plasma processing time $T_2$ is preferably 30 sec or more.

(Hardware of Control Unit 20)

Figure 12:
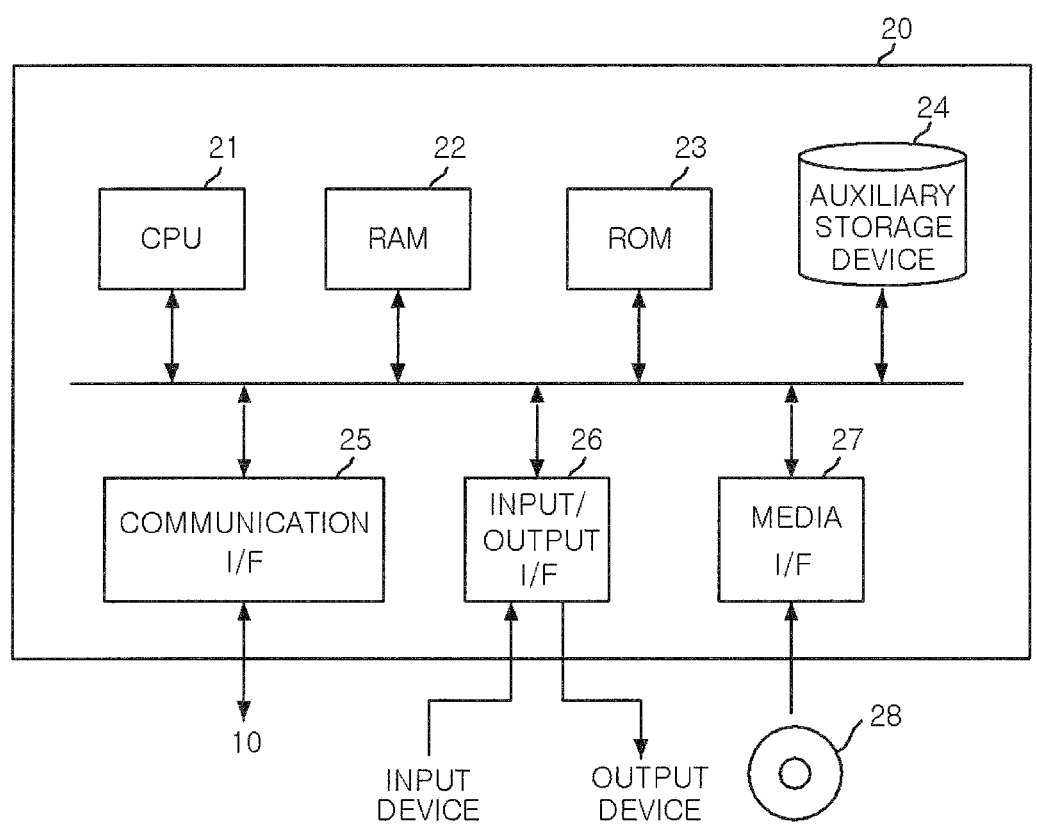
FIG. 12 shows an example of a hardware of a control unit.

FIG. 12 shows an example of the hardware of the control unit 20. As shown in FIG. 12, for example, the control unit 20 includes a CPU 21, a RAM 22, a ROM 23, an auxiliary storage device 24, a communication interface (I/F) 25, an input/output interface (I/F) 26, and a media interface (I/F) 27.

The CPU 21 operates to control the respective components based on a program stored in the ROM 23 or the auxiliary storage device 24. The ROM 23 stores a boot program executed by the CPU 21 at the time of starting the control unit 20, a program dependent on the hardware of the control unit 20, and the like.

The auxiliary storage device 24 is, e.g., an HDD (Hard Disk Drive) or an SSD (Solid State Drive), and stores a program to be executed by the CPU 21, data used by the program, and the like. The CPU 21 reads out a program stored in the auxiliary storage device 24 from the auxiliary storage device 24, loads the read-out program on the RAM 22, and executes the loaded program. The communication I/F 25 receives signals from the respective components of the main body 10 through a communication cable, transmits the signals to the CPU 21, and transmits signals generated by the CPU 21 to the respective components of the main body 10 through the communication cable.

The CPU 21 controls an output device such as a display or the like, and an input device such as a keyboard, a mouse or the like through the input/output I/F 26. The CPU 21 acquires data from the input device through the input/output I/F 26. Further, the CPU 21 outputs the generated data to the output device through the input/output I/F 26.

The media I/F 27 reads out a program, data, or the like stored in a recording medium 28 and stores it in the auxiliary storage device 24. The recording medium 28 may be, e.g., an optical recording medium such as a DVD (Digital Versatile Disc), a PD (Phase change rewritable disk) or the like, a magneto-optical recording medium such as MO (Magneto-Optical disk) or the like, a tape medium, a magnetic recording medium, a semiconductor memory, or the like. The control unit 20 may acquire a program or the like stored in the auxiliary storage device 24 from another device through a communication cable or the like and store the acquired program or the like in the auxiliary storage device 24.

The embodiment of the plasma processing apparatus 100 has been described above. As apparent from the above description, in accordance with the plasma processing apparatus 100 of the present embodiment, the generation of particles due to the ashing process using plasma of $H_2$ gas can be suppressed.

(Other Applications)

The present disclosure is not limited to the above-described embodiment, and various modifications can be made within the scope of the gist of the present disclosure.

For example, $H_2$ gas has been described as an example of a hydrogen-containing gas in the above-described embodiment. However, the present disclosure it not limited thereto. The hydrogen-containing gas may be, e.g., a gas containing at least one of $H_2$ gas and $H_2O$ gas.

$O_2$ gas has been described as an example of an oxygen-containing gas in the above-described embodiment. However, the present disclosure is not limited thereto. The oxygen-containing gas may be, e.g., a gas containing at least one of $O_2$ gas, CO gas, $CO_2$ gas, and $O_3$ gas.

Although the consumption of the upper ceiling plate 102 made of quartz that is a silicon oxide has been described in the above-described embodiment, the present disclosure can also suppress the consumption of the upper ceiling plate 102 made of a ceramic material such as a metal oxide, e.g., $Al_2O_3$, $Y_2O_3$, or the like, or the components in the chamber 101 which are made of a silicon-containing material or a metal oxide. Accordingly, the generation of particles can be suppressed.

In the above-described embodiment, the ashing process has been described as an example of the process performed on the semiconductor wafer W by using plasma of a hydrogen-containing gas. However, even in other processes performed on the wafer W by using plasma of a hydrogen-containing gas, such as etching, film formation or the like, the components in the chamber 101 which are made of quartz or the like are consumed and particles are generated. Therefore, even in other processes performed on the semiconductor wafer W by using plasma of a hydrogen-containing gas, the consumption of the components can be suppressed by generating an $O_2$ plasma in the chamber 101 between the processes as in the above-described embodiment. Accordingly, the generation of particles can be suppressed.

In the above-described embodiment, the plasma processing apparatus 100 for performing processing on the semiconductor wafer W by using an inductively coupled plasma as plasma source has been described as an example. However, the present disclosure is not limited thereto. As long as the plasma processing apparatus 100 for performing processing on the semiconductor wafer W by using a plasma is used, the plasma source is not limited to the inductively coupled plasma and may be any plasma source such as a capacitively coupled plasma, a microwave plasma, a magnetron plasma or the like.

While the present disclosure has been shown and described with respect to the embodiments, it will be understood by those skilled in the art that various changes and modifications may be made without departing from the scope of the present disclosure as defined in the following claims.

What is claimed is:

1. A plasma processing method comprising:
a substrate processing step of performing predetermined processing on a target substrate loaded into a chamber by using plasma of a gaseous mixture consisting of a hydrogen-containing gas and a rare gas and unloading the processed substrate from the chamber, wherein the hydrogen-containing gas is at least one of $H_2$ gas and $H_2O$ gas; and
an in-chamber processing step of processing surfaces of components in the chamber by plasma of an oxygen-containing gas after the substrate processing step is performed at least once,
wherein in the substrate processing step, reduced surfaces are formed in which surfaces of the components in the chamber are reduced by the plasma of the gaseous mixture consisting of the hydrogen-containing gas and the rare gas and hydrogen radicals contained in the plasma of the gaseous mixture enter a crystal structure of the surfaces of the components and cut bonding in the crystal structure,
in the in-chamber processing step, the reduced surfaces of the components in the chamber are oxidized by the plasma of the oxygen-containing gas and oxygen radicals contained in the plasma of the oxygen-containing gas enter the reduced surfaces of the components to reconstruct the crystal structure, and
the substrate processing step is performed again at least once after the in-chamber processing step.

2. The plasma processing method of claim 1, wherein an organic material is adhered to a surface of the target substrate, and
in the substrate processing step, the organic material adhered to the surface of the target substrate is removed by using the plasma of the gaseous mixture.

3. The plasma processing method of claim 1, wherein one or more substrate processing steps and the in-chamber processing step are alternately performed, and
wherein the plasma processing method further comprises:
a preparation step of preparing plasma of the hydrogen-containing gas in the chamber after the in-chamber processing step and before the next one or more the substrate processing steps.

4. The plasma processing method of claim 3, wherein a ratio of a processing time of one in-chamber processing step to an accumulated time of the predetermined processing performed by using the plasma of the gaseous mixture in the substrate processing step performed between the in-chamber processing step and the next in-chamber processing step is 20% or more.

5. The plasma processing method of claim 4, wherein an accumulated time of the predetermined processing performed by using the plasma of the gaseous mixture in the substrate processing step performed between the in-chamber processing step and the next in-chamber processing step is 1500 sec or less, and a processing time of the in-chamber processing step is 300 sec or more.

6. The plasma processing method of claim 1, wherein the in-chamber processing step is further performed before the initial substrate processing step.

7. The plasma processing method of claim 1, wherein the oxygen-containing gas contains at least one of $O_2$ gas, CO gas, $CO_2$ gas, and $O_3$ gas.

8. The plasma processing method of claim 1, wherein the components in the chamber are made of silicon oxide or metal oxide.

9. The plasma processing method of claim 1, wherein the components in the chamber are made of quartz or ceramic.

10. The plasma processing method of claim 1, wherein the in-chamber processing step is performed when an accumulated time of the predetermined processing performed in the substrate processing step prior to the in-chamber processing step is greater than a predetermined threshold value.

11. The plasma processing method of claim 1, wherein two or more substrate processing steps and the in-chamber processing step are alternately performed, and
wherein a ratio of a processing time of one in-chamber processing step to an accumulated time of the predetermined processing performed by using the plasma of the gaseous mixture in the two or more substrate processing steps performed between the in-chamber processing step and the next in-chamber processing step is 20% or more.

* * * * *